United States Patent [19]
Nakaoka

[11] Patent Number: 4,886,984
[45] Date of Patent: Dec. 12, 1989

[54] PROHIBITION CIRCUIT UPON POWER-ON EVENT
[75] Inventor: Yuji Nakaoka, Tokyo, Japan
[73] Assignee: NEC Corporation, Tokyo, Japan
[21] Appl. No.: 172,750
[22] Filed: Mar. 28, 1988
[30] Foreign Application Priority Data
  Mar. 27, 1987 [JP] Japan .................................. 62-74901
[51] Int. Cl.[4] ........................ H03K 3/284; H03K 5/13
[52] U.S. Cl. ................................ 307/272.3; 307/269; 328/63
[58] Field of Search .............. 307/296.4, 296.5, 272.3, 307/200 A, 200 B, 443, 572, 269, 480; 328/63

[56] References Cited
U.S. PATENT DOCUMENTS
4,736,119 4/1988 Chen et al. ........................ 307/269

FOREIGN PATENT DOCUMENTS
16414 1/1984 Japan .

Primary Examiner—John S. Heyman
Assistant Examiner—Richard Roseen
Attorney, Agent, or Firm—Sughrue, Mion, Zinn, Macpeak & Seas

[57] ABSTRACT

For preventing a power consuming circuit from undesirable operation upon a power on event, there is disclosed a prohibition circuit operative to produce a control signal supplied to the power consuming circuit for a prohibition of an operation carried out by the power consuming circuit on the basis of an external signal, the prohibition circuit comprises a raw control signal producing circuit operative to produce a raw control signal shifted from an inactive voltage level to an active voltage level after the power switch on event, the raw control signal is shifted from the active voltage level to the inactive voltage level when a power voltage level excesses a certain voltage level, the prohibition circuit further comprises an adjusting circuit responsive to the raw control signal and the external control signal and operative to produce the control signal of the active voltage level when the raw control signal is shifted from the inactive voltage level to the active voltage level regardless of the voltage level of the external signal, and the adjusting circuit continues to produce the control signal of the active voltage level regardless of the voltage level of the raw control signal until the external signal is shifted from an active voltage level to an inactive voltage level.

13 Claims, 6 Drawing Sheets

PRIOR-ART

PRIOR-ART

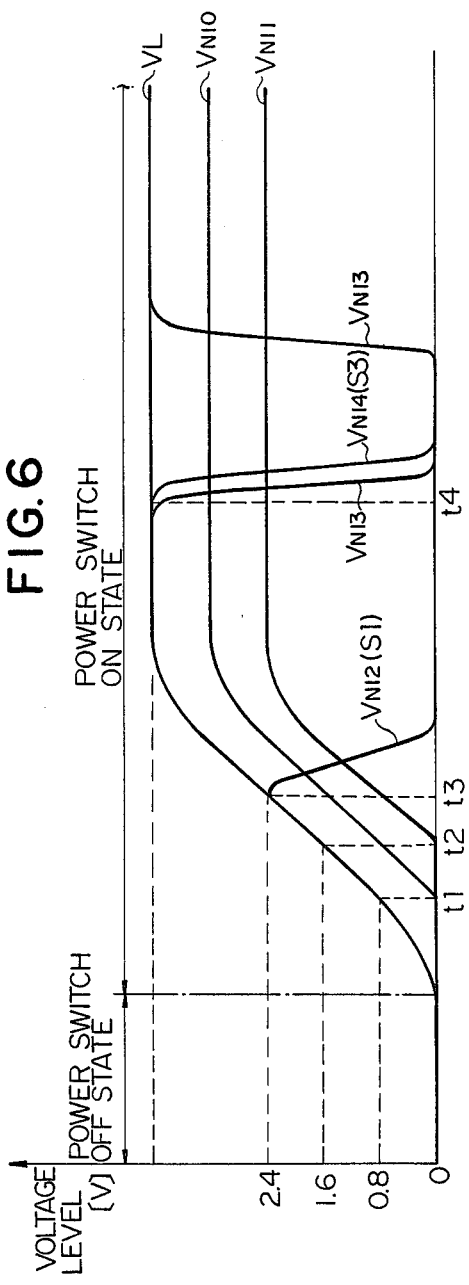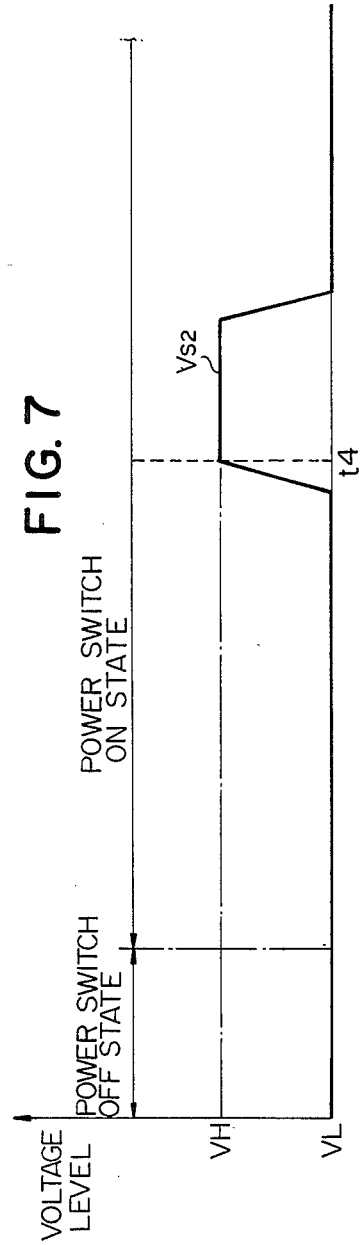

PROHIBITION CIRCUIT UPON POWER-ON EVENT

FIELD OF THE INVENTION

This invention relates to a prohibition circuit for power consuming circuits and, more particularly, to a prohibition circuit operative to forcibly prohibit power consuming circuits from undesirable operations upon power-on event.

BACKGROUND OF THE INVENTION

In general, a semiconductor integrated circuit needs a relatively long time period from a power switch on-event to a ready for operation state due to unstable power voltage level. This is because of the fact that power consuming circuits of the integrated circuit have not yet initialized yet, so that some power consuming circuits are put into oscillation states and another power consuming circuit such as an inverter circuit is switched into simultaneous on-states of the component transistors coupled in series between a source of voltage and a ground terminal. These unstable power consuming circuits consume a large amount of electric power which can exceed the capability of the power supply circuit incorporated in the integrated circuit, and, for this reason, the integrated circuit needs a relatively long time period to become ready for the operational state.

For acceleration to the stable state, a semiconductor integrated circuit employs a prohibition circuit, and a typical example of the prohibition circuit is illustrated in FIG. 1 of the drawings. The prohibition circuit illustrated in FIG. 1 comprises a first series combination of p-channel MOS type field effect transistors 1 and 2 and an n-channel MOS type field effect transistor 3 coupled between a source of power voltage Vdd and a ground terminal, a second series combination of a p-channel MOS type field effect transistor 4 and an n-channel MOS type field effect transistor 5, and two inverter circuits 6 and 7 coupled in series. The second series combination serves as an inverter circuit which is similar in circuit arrangement of each of the inverter circuit 6 and 7. The p-channel MOS type field effect transistor 1 has a gate electrode coupled to a first node N1 provided between the two p-channel MOS type field effect transistors 1 and 2 and the n-channel MOS type field effect transistor 2 has a gate electrode coupled to a second node N2 provided between the two MOS type field effect transistors 2 and 3 different in channel conductivity type from each other, but the n-channel MOS type field effect transistor 3 has a gate electrode coupled to the source of power voltage Vdd. The second node N2 in turn is coupled to gate electrodes of the two MOS type field effect transistor forming the second series combination, and the second series combination has a third node N3 provided between the two component MOS type field effect transistors 4 and 5. The third node N3 is coupled to the input node of the inverter circuit 6 and the two inverter circuits 6 and 7 respectively have fourth and fifth nodes N4 and N5 serving as the respective output nodes. As to current driving capabilities of the MOS type field effect transistors, the n-channel MOS type field effect transistor 3 is very much smaller in current driving capability than each of the p-channel MOS type field effect transistors 1 and 2, but the p-channel MOS type field effect transistor 4 is very much smaller in current driving capability than the n-channel MOS type field effect transistor 5.

The prior-art prohibition circuit thus arranged is operative to produce a control signal S1 supplied to a switching transistor forming part of the power consuming circuit ( not shown ) which has a probability of the oscillation or the simultaneous on-states of the component transistors. Assuming now that all of the p-channel MOS type field effect transistors 1, 2 and 4 and all of the n-channel MOS type field effect transistors 3 and 5 have respective threshold voltages Vtp and Vtn which are identical in absolute value $V_{THab}$ with each other.

Prior to the power switch on-operation, all of the nodes N1 to N5 are in the ground voltage level as will be seen from FIG. 2 of the drawings When the power switch is shifted from the off-state to the on-state, the voltage level VL supplied from the source of power voltage Vdd is gradually increased, but the p-channel MOS type field effect transistor 1 does not turn on until the voltage level VL reaches a voltage level approximately equal to the absolute value $V_{THab}$. However, if the voltage level VL exceeds the absolute value $V_{THab}$ at time t1, the p-channel MOS type field effect transistor 1 turns on to provide a conduction path between the source of power voltage Vdd and the first node N1, then the first node N1 begins to go up in parallel to the voltage level VL. Similarly, the p-channel MOS type field effect transistor 2 does not turn on until a voltage level $V_{N1}$ at the first node N1 reaches a voltage level approximately equal to the absolute value $V_{THab}$, so that a voltage level $V_{N2}$ at the second node N2 remains in the ground level in this stage.

If the voltage level VL exceed a voltage level twice as large as the absolute value $V_{THab}$ at time t2, the voltage level $V_{N1}$ also exceeds the voltage level approximately equal to the absolute value $V_{THab}$, thereby allowing the p-channel MOS type field effect transistor 2 to turn on. Although the n-channel type MOS field effect transistor 3 is turned on, the n-channel MOS type field effect transistor 3 is very much smaller in current driving capability than the p-channel MOS type field effect transistor 2. This means that the voltage level $V_{N2}$ is increased in substantially parallel to the voltage level $V_{N1}$ and, accordingly, to the voltage level VL. However, voltage level $V_{N3}$ at the third node N3 remains in the ground level until the voltage level $V_{N2}$ reaches the voltage level approximately equal to the absolute value $V_{THab}$. Then, the p-channel MOS type field effect transistor 4 is turned off to keep a voltage level $V_{N3}$ at the third node N3 in the ground level until time t1; however the voltage level $V_{N3}$ at the third node N3 is increased in parallel to the voltage level $V_{N1}$ after time t1 because the n-channel MOS type field effect transistor 5 is turned off. Each of the inverter circuits 6 and 7 is similar in circuit arrangement as described hereinbefore, so that a voltage level $V_{N5}$ at the fifth node N5 or the control signal S1 is also increased identically with the voltage level $V_L$. The switching transistor of the power consuming circuit is designed to be turned off in the voltage level $V_{N5}$ over the absolute value $V_{THab}$. The power consuming circuit is protected from the oscillation or the simultaneous on-states of the component transistors. If the voltage level VL reaches a voltage level approximately three times larger than the absolute value $V_{THab}$ at time t3, the voltage level $V_{N2}$ also reaches the voltage level approximately equal to the absolute value $V_{THab}$, so that the n-channel MOS type field effect transistor 5 turns on to provide a conduction path between the node N3 and the ground terminal. The voltage level $V_{N3}$ rapidly goes down toward the ground voltage level due to the difference in current driving capability between the MOS type field effect transistors 4 and 5, and, accordingly, a voltage level $V_{N4}$ at the fourth node N4 goes up over the voltage level approximately twice larger than the absolute value $_{THab}$. The result is that the fifth node N5 or the control signal S1 is rapidly decreased in voltage level as shown in FIG. 2, so that the switching transistor turns on to activate the power consuming circuit.

After activation of the power consuming circuit, the voltage level VL is continuously increased to a voltage level approximately five times larger than the absolute value $V_{THab}$ where no undesirable oscillation or no simultaneous on-states of the component transistors takes place.

However, a problem is encountered in the integrated circuit with the prior-art prohibition circuit illustrated in FIG. 1 in that undesirable circuit operations take place in the power consuming circuits. Specifically, if the prior-art prohibition circuit is incorporated in, for example, a data processing unit, the prohibition circuit prohibits the power consuming circuits of the data processing unit from activation until the stable power voltage level which is three times larger than the absolute value in the example illustrated in FIG. 1. However, the data processing unit is usually supplied with a clock signal from an external clock generator even if the source of power voltage does not reach the stable level. Then, the power consuming circuits begin to carry out the respective operations prior to execution of an initialization program. For example, a power consuming circuit serving as an arithmetic circuit may execute the operation to produce data bits which may be transferred to the outside thereof by another power consuming circuit serving as a data output buffer circuit. The power consuming circuits consume a large amount of electric power during such undesirable operations, so that the power consumption may hardly be reduced in some applications such as a data processing unit.

SUMMARY OF THE INVENTION

It is therefore an important object of the present invention to provide a prohibition circuit upon power-on event which prohibits power consuming circuits from undesirable operation after the power switch on event.

It is another important object of the present invention to provide a prohibition circuit upon the power-on event which reduces power consumption to a desired level.

In is still another important object of the present invention to provide a prohibition circuit upon power-on event which is widely applicable to an integrated circuit.

To accomplish these objects, the present invention proposes to elongate the prohibiting period until an external signal allows a usual operation.

In accordance with the present invention, there is provided a prohibition circuit operative to produce a control signal supplied to a power consuming circuit for prohibition of an operation carried out by the power consuming circuit on the basis of an external signal shifted between an active first voltage level and an inactive second voltage level, the control signal being shifted between an inactive third voltage level and an active fourth voltage level, comprising, a) a raw control signal producing circuit operative to produce a raw control signal shifted from an inactive fifth voltage level to an active sixth voltage level after a power switch on event, the raw control signal being shifted from the active sixth voltage level to the inactive fifth voltage level when a power voltage level exceeds a certain voltage level, and b) an adjusting circuit responsive to the raw control signal and the external control signal and operative to produce the control signal of the active fourth voltage level when the raw control signal is shifted from the inactive fifth voltage level to the active sixth voltage level regardless of the voltage level of the external signal, the adjusting circuit being operative to continue to produce the control signal of the active fourth voltage level regardless of the voltage level of the raw control signal until the external signal is shifted from the active first voltage level to the inactive second voltage level.

The raw control signal producing circuit may comprise a level shifting circuit operative to produce an output signal following the power voltage level and a first series combination of inverter circuits supplied with the output signal from the level shifting circuit to produce the raw control signal. In one implementation, the level shifting circuit comprises a plurality of first load transistors respectively having first conductivity channels and coupled in series between a source of power voltage and an output node thereof, a switching transistor of a second conductivity channel and coupled between the output node and a ground terminal and a second load transistor having the second conductivity channel and coupled between the source of power voltage and the output node thereof, and each of the first load transistors is larger in current driving capability than the switching transistor. Each of the inverter circuits forming the first series combination may have a p-channel type field effect transistor and an n-channel type field effect transistor coupled in series between the source of power voltage and the ground terminal, and the n-channel type field effect transistor is larger in current driving capability than the p-channel type field effect transistor.

On the other hand, the adjusting circuit may comprise a second series combination of inverter circuits supplied with the external signal to produce an output signal and a logic circuit responsive to the output signal of the second series combination and the control signal to change the voltage level of the control signal, and the logic circuit in turn comprises a NAND gate supplied with the output signal of the second series combination and the control signal, a first inverter circuit having an input node coupled to an output node of the NAND gate, a NOR gate supplied with the output signal of the first series combination and an output signal appearing at an output node of the first inverter circuit, and a second inverter circuit having an input node coupled to an output node of the NOR gate to produce the control signal appearing at an output node of the second inverter circuit. In another implementation, each of the inverter circuits forming the second series combination and the first and second inverter circuits has a p-channel type field effect transistor and an n-channel type field effect transistor coupled in series between the source of power voltage and the ground terminal, and the NAND gate has two p-channel type field effect transistors coupled in parallel between the source of power voltage and an output node thereof and two n-channel type field effect transistors coupled in series between the output node thereof and the ground terminal. In order to realize the NAND operation, wherein one of the p-channel type field effect transistors and one of the n-channel type field effect transistors have respective gate electrodes supplied with the output signal of the second series combination but the other of the p-channel type field effect transistors and the other of the n-channel type field effect transistors have respective gate electrodes supplied with the control signal. Moreover, the NOR gate has two p-channel type field effect transistors coupled in series between the source of power voltage and an output node thereof and two n-channel type field effect transistors coupled in parallel between the output node thereof sand the ground terminal, and one of the p-channel type field effect transistors and one of the n-channel type field effect transistors have respective gate electrodes supplied with the output signal of the first series combination, but the other of the p-channel type field effect transistors and the other of the n-channel type field effect transistors have respective gate electrodes supplied with the output signal of the first inverter circuit.

As to the power consuming circuit, a data output buffer circuit may be an example.

BRIEF DESCRIPTION OF THE DRAWINGS

The features and advantages of a prohibition circuit according to the present invention will be more clearly understood from the following description taken in conjunction with the accompanying drawings in which:

FIG. 6 is a diagram showing waveforms of voltage levels appearing at the essential nodes of the prohibition circuit illustrated in FIG. 3; and FIG. 7 is a diagram showing a waveform of an external clock signal supplied to the prohibition circuit illustrated in FIG. 3.

DESCRIPTION OF THE PREFERRED EMBODIMENT

Figure 3:
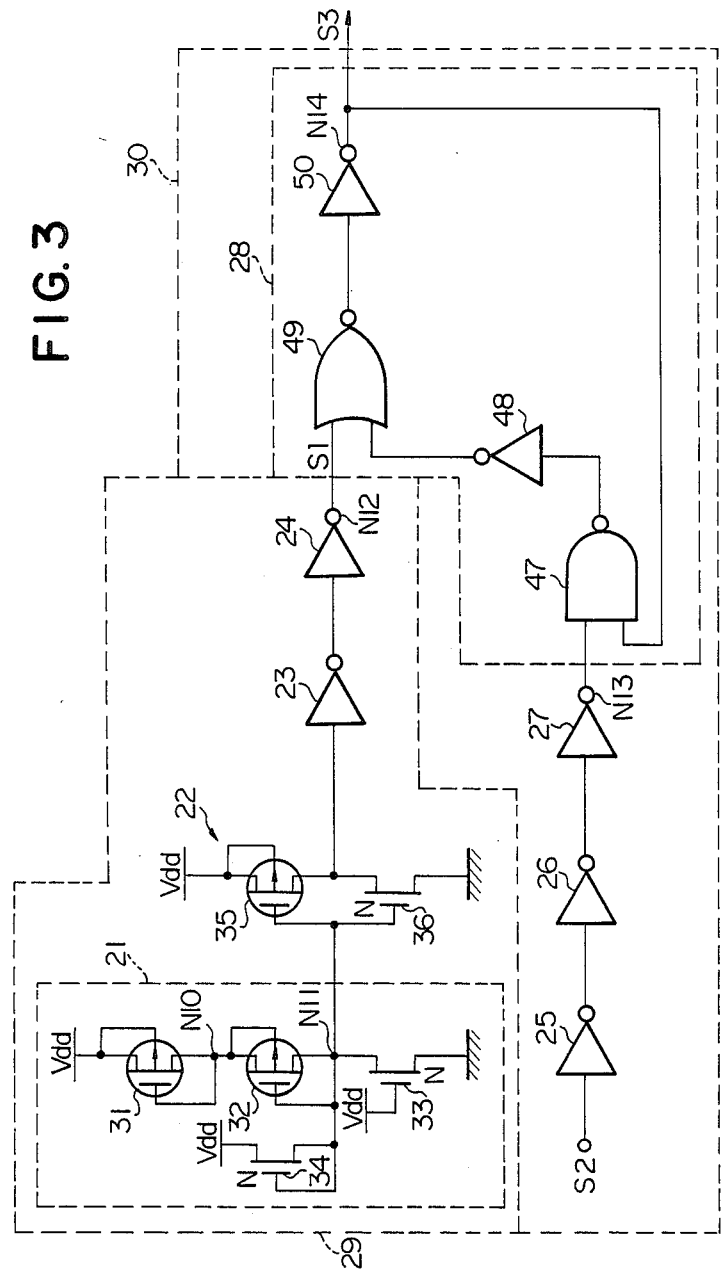
FIG. 3 is a diagram showing the circuit arrangement of a prohibition circuit embodying the present invention.

Referring first to FIG. 3 of the drawings, there is shown the circuit arrangement of a prohibition circuit embodying the present invention. The protection circuit illustrated in FIG. 3 largely comprises a level shifting circuit 21, a first series combination of three inverter circuits 22, 23 and 24, a second series combination of three inverter circuits 25, 26 and 27, and a logic circuit 28, and is fabricated on a semiconductor substrate ( not shown ) together with power consuming circuits to form an integrated circuit. The integrated circuit further forms an electronic system together with other integrated circuits including an external signal source.

In this instance, the level shifting circuit 21 and the first series combination of the inverter circuits as a whole constitute a raw control signal producing circuit 29, and the second series combination of the inverter circuits and the logic circuit 28 form in combination an adjusting circuit 30.

The level shifting circuit 21 comprises two p-channel MOS type field effect transistors 31 and 32 nd an n-channel MOS type field effect transistor 33 coupled in series between a source of power voltage Vdd and a ground terminal and an n-channel MOS type field effect transistor 34 coupled between the source of power voltage Vdd and an output node N11 of the level shifting circuit 21. The common drain node of the MOS type field effect transistors 31 and 32 is denoted by N10. In this instance, each of the p-channel MOS type field effect transistors 31 and 32 is very much larger in current driving capability or transconductance than the n-channel MOS type field effect transistor 33. The inverter circuit 22 is formed by a p-channel MOS type field effect transistor 35 and an n-channel MOS type field effect transistor 36 coupled in series between the source of power voltage Vdd and the ground terminal, and the n-channel MOS type field effect transistor 36 is very much larger in current driving capability than the p-channel MOS type field effect transistor 35. As will be better seen from FIG. 4, each of the other inverter circuits 23 and 24 is similar in circuit arrangement to the inverter circuit 22, so that corresponding p-channel MOS type field effect transistors and corresponding n-channel MOS type field effect transistors are merely designated by reference numerals 35, 36, 37, 38, 39 and 40, respectively, without detailed description. A raw control signal S1 appears at the output node N12 of the inverter circuit 24. Each of the inverter circuits 25 to 27 forming the second series combination is provided with a p-channel MOS type field effect transistor 41, 42 or 43 and an n-channel MOS type field effect transistor 44, 45 or 46 coupled in series between the source of power voltage Vdd and the ground terminal, and an external signal S2 such as, for example, a clock signal is supplied to the gate electrodes of the MOS type field effect transistors 41 and 44 of the first inverter circuit 25, and the inverse signal of the external signal S2 is produced at the output node N13 of the inverter circuit 27.

Figure 4:
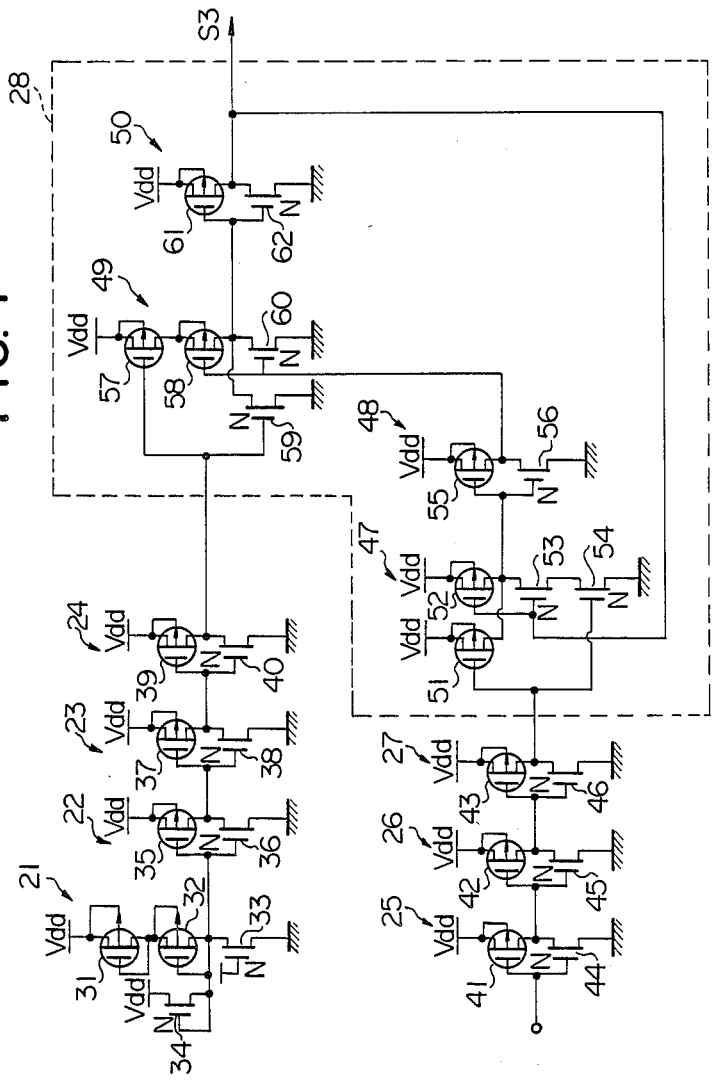
FIG. 4 is a diagram showing in detail the arrangement of the prohibition circuit illustrated in FIG. 3.

Turning back to FIG. 3 of the drawings, the logic circuit 28 comprises a NAND gate 47, an inverter circuit 48, a NOR gate 49 and an inverter circuit 50. The NAND gate 47 has two input nodes coupled to the respective output nodes of the inverter circuits 27 and 50, and the inverter circuit 48 is electrically connected to the output node of the NAND gate 47. On the other hand, the NOR gate 49 has two input nodes one of which is coupled to the output node of the inverter circuit 24 and the other of which is coupled to the output node of the inverter circuit 48. The output node of the NOR gate 49 is coupled to the inverter circuit 50, and a control signal S3 appears at the output node N14 of the inverter circuit 50. The detailed circuit arrangement of the logic circuit 28 is illustrated in FIG. 4 of the drawings. The NAND gate 47 have two p-channel MOS type field effect transistors 51 and 52 coupled in parallel between the source of power voltage source Vdd and the output node thereof and two n-channel MOS type field effect transistors 53 and 54 coupled in series between the output node thereof and the ground terminal. The MOS type field effect transistors 51 and 54 are provided with respective gate electrodes coupled to the output node N13 of the inverter circuit 27, but the MOS type field effect transistors 52 and 53 are provided with respective gate electrodes coupled to the output node N14 of the inverter circuit 50. The NAND gate 47 thus arranged produces an output signal of logic "0" level when logic "1" levels concurrently appear at the output nodes N13 and N14 of the inverter circuits 27 and 50. However, if at least one of the output nodes N13 and N14 goes down to the logic "0" level, the NAND gate 47 yields the output signal of the logic "1" level due to either n-channel MOS type field effect transistor 53 or 54 in the off-state. The inverter circuit 48 is formed by a p-channel MOS type field effect transistor 55 and an n-channel MOS type field effect transistor 56 coupled in series between the source of power voltage Vdd and the ground terminal, so that the inverse signal appears at the output node thereof by alternative switching operations of the component transistors 55 and 56. On the other hand, the NOR gate 49 is formed by two p-channel MOS type field effect transistors 57 and 58 coupled in series between the source of power voltage Vdd and an output node thereof and two n-channel MOS type field effect transistors 59 and 60 coupled in parallel between the output node thereof and the ground terminal. The MOS type field effect transistors 57 and 59 have respective gate electrodes coupled to the output node N12, but the MOS type field effect transistors 58 and 60 have respective gate electrodes coupled to the output node of the inverter circuit 48. The NOR gate thus arranged yields an output signal of logic "1" level on the basis of the concurrent logic "0" levels appearing at the respective output nodes of the inverter circuits 24 and 48 because both of the n-channel MOS type field effect transistors 59 and 60 are turned off. However, if one of the output nodes of the inverter circuits 24 and 48 goes up to the logic "1" level, the NOR gate 49 produces the output signal of the logic "0" level due to at least one n-channel MOS type field effect transistor 59 or 60 in the on-state. The inverter circuit 50 is also formed by a p-channel field effect transistor 61 and an n-channel MOS type field effect transistor 62 coupled in series between the source of power voltage and the ground terminal, so that the inverse signal or the control signal S3 appears at the output node N14 of the inverter circuit 50 on the basis of the alternative switching operations of the component MOS type field effect transistors 61 and 62. In this instance, the source of power voltage produces a voltage level VL of about 5.0 volts and the semiconductor substrate is biased to −3.5 volts, then each of the p-channel MOS type field effect transistors has a threshold voltage of about −0.8 volt and each of the n-channel MOS type field effect transistors has a threshold voltage of about 0.8 volt. As a result, all of the MOS type field effect transistors have the threshold voltages approximately equal in absolute value to one another.

Figure 5:
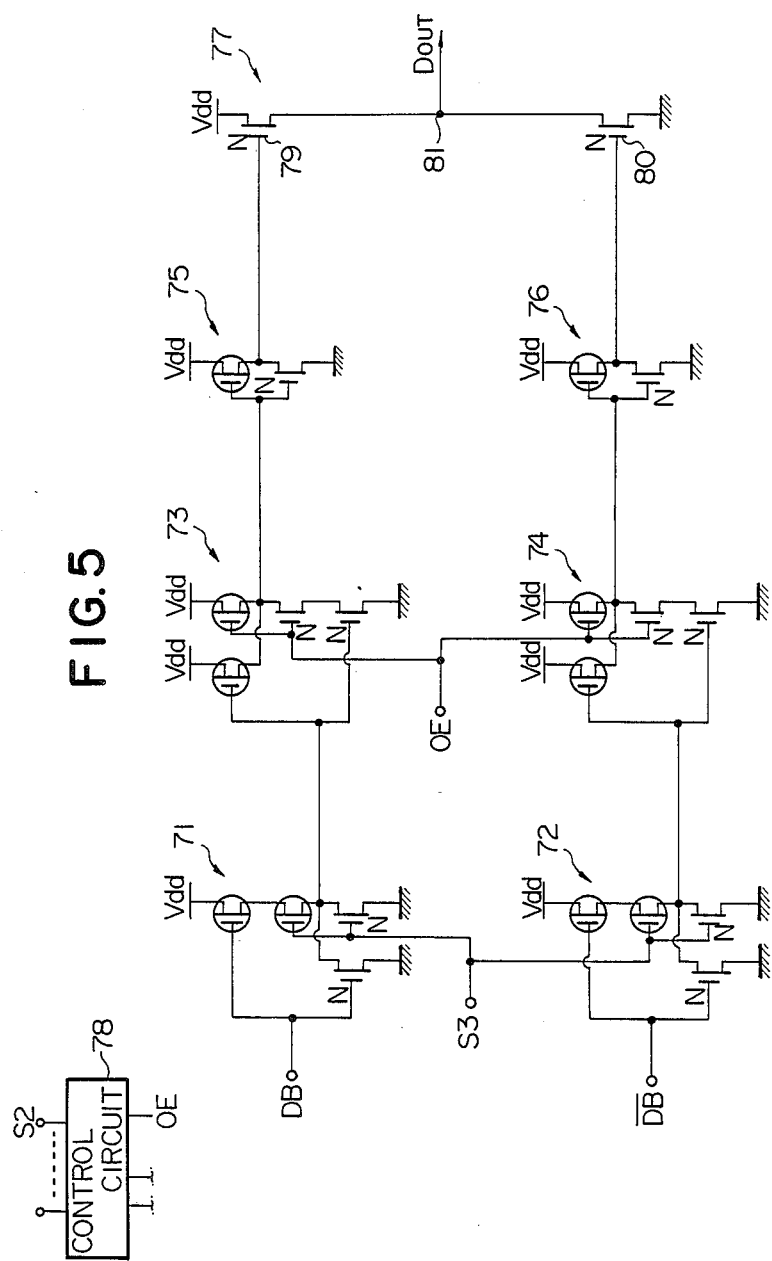
FIG. 5 is a diagram showing the circuit arrangement of a data output buffer circuit supplied with the control signal produced in the prohibition circuit illustrated in FIG. 3.

Turning to FIG. 5 of the drawings, there is shown one of the power consuming circuits serving as a data output buffer circuit. The data output buffer circuit illustrated in FIG. 5 largely comprises two NOR gates 71 and 72, two NAND gates 73 and 74, two inverter circuits 75 and 76 and an inverter circuit 77 with a large current driving capability, and each of the component logic gates 71 to 76 is similar in circuit arrangement to the corresponding logic gate 47, 48 or 49, so that no further description will be made for the circuit arrangements of these logic gates 71 to 76. Each of the NOR gates 71 and 72 has two input nodes one of which is supplied with a data bit DB or the inverse of the data bit fed from a data amplifier circuit (not shown) and the other of which is supplied with the control signal S3 fed from the prohibition circuit illustrated in FIG. 3, so that both of the NOR gates 71 and 72 are shifted to inactive states in the presence of the control signal S3 of the logic "1" level but are activated in the presence of the control signal of the logic "0" level. Namely, an output signal of logic "0" level appears at the output node of each NOR gate regardless of the data bit if the control signal S3 of the logic "1" level appears at one of the input nodes. On the other hand, if the control signal S3 is shifted to the logic "0" level, each of the NOR gates produces the output signals of logic "1" or logic "0" level depending upon the logic level of the data bit DB. Both of the NOR gates 71 and 72 are coupled to the NAND gates 73 and 74, respectively. Each of the NAND gates 73 and 74 has two input nodes one of which is supplied with an output enable signal OE from a control circuit 78 and the other of which is coupled to the output node of the NOR gate 71 or 72, so that both of the NAND gates 73 and 74 respectively transfer the output signals of the NOR gates 71 and 72 to the inverter circuits 75 and 76 in the presence of the output enable signal OE of the logic "1" level. After respective inversions of the output signals fed from the NAND gates 73 and 74, n-channel MOS type field effect transistors 79 and 80 forming the inverter circuit 77 are alternatively shifted between the on-states and the off-states, respectively, so that an output data bit $D_{OUT}$ appears at an output node 81.

Figure 1:
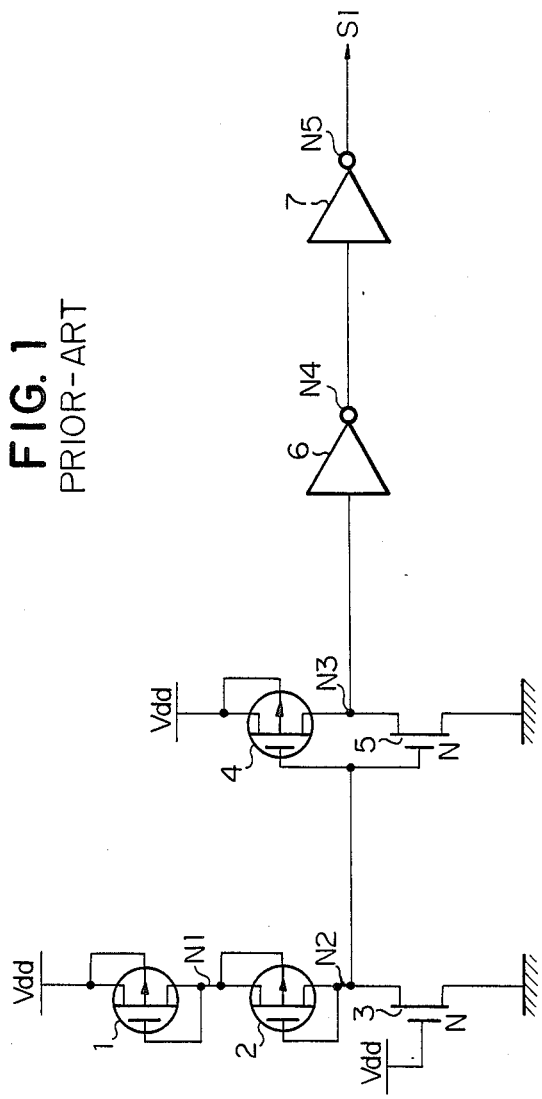
FIG. 1 is a diagram showing the circuit arrangement of a prior-art prohibition circuit.
Figure 2:
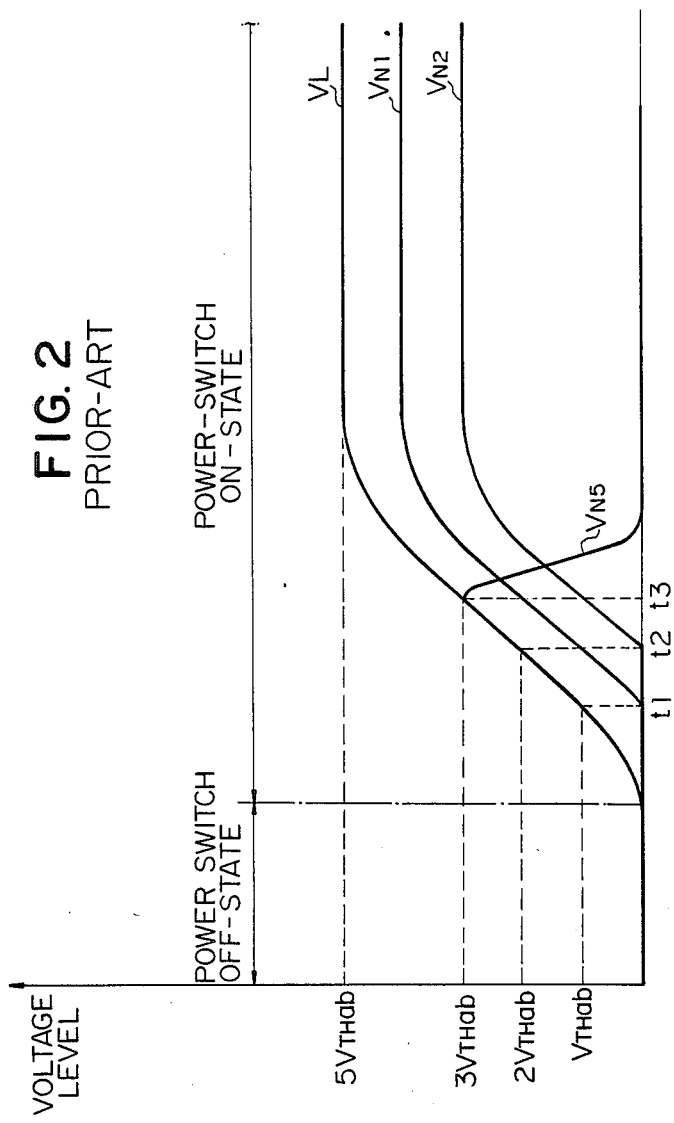
FIG. 2 is a diagram showing waveforms of voltage levels appearing at essential nodes of the prior-art prohibition circuit illustrated in FIG. 1.

Description will be made for an operation of the prohibition circuit illustrated in FIG. 3 with reference to FIGS. 6 and 7 of the drawings. The raw control signal producing circuit is similar in operation to the prior-art prohibition circuit illustrated in FIG. 1, so that detailed description of the raw control signal producing circuit from time t1 to time t3 is omitted for the sake of simplicity. In FIGS. 6 and 7, plots $V_{N10}$ to $V_{N14}$ represent the respective voltage levels appearing at the nodes N10 to N14, and plot $V_{S2}$ represents the voltage level of the external signal S2 swinging its voltage level between inactive high and active low voltage levels VH and VL. When the raw control signal S1 exceeds the threshold voltage of about 0.8 volt at time t2, the NOR gate 49 is supplied with the logic "1" level, thereby producing the output signal of logic "0" regardless of the output signal of the inverter circuit 48. This results in the control signal S3 of the logic "1" level which in turn results in prohibiting the data output buffer circuit from activation. Moreover, when the control signal S3 is shifted to the logic "1" level, the NAND gate 47 can respond to the output signal of the inverter circuit 27.

If the raw control signal S1 goes down toward the ground level at time t3 and reaches a voltage level below the threshold voltage, the NOR gate is supplied with the logic "0" level from the inverter circuit 24, thereby being allowed to respond to the logic level fed from the inverter circuit 48. In this situation, if the external signal S2 is in the active low voltage level VL, the NAND gate 47 is supplied with the logic "1" levels from the inverter circuits 27 and 50, so that the NAND gate 47 yields the logic "0" level and, accordingly, the inverter circuit 48 supplies the logic "1" level to the NOR gate 49. With the logic "0" level and the logic "1" level, the NOR gate 49 continues to produce the output signal of the logic "0" level which results in the inverter circuit 50 keeping the control signal S3 in the active logic "1" level. Then, the control signal S3 continues to prohibit the data output buffer circuit from activation even if the raw control signal goes down to the inactive low level. This means that the data output buffer circuit is prevented from an undesirable operation on the basis of the external signal S2 fed to the control circuit 78.

If the electronic system is shifted into the ready for operation state, the external signal S2 is shifted to the inactive high level VH at time t4, then the inverter circuit 27 shifts the output signal from the logic "1" level to the logic "0" level. With the logic "0" level and the logic "1" level fed from the inverter circuits 27 and 50, the NAND gate 47 produces the logic "1" level which is inverted by the inverter circuit 48. This results in the logic "1" level at the output node of the NOR gate 49, and, for this reason, the control signal S3 is shifted from the logic "1" level to the logic "0" level. With the control signal S3 of the inactive logic "0" level, the data output buffer circuit is activated to transfer a data bit to a destination.

As will be understood from the foregoing description, the prohibition circuit according to the present invention is advantageous over the prior art in preventing the power consuming circuit from an undesirable operation. Thus, the amount of electric power required is reduced by virtue of the prohibition circuit according to the present invention.

Although particular embodiment of the present invention have been shown and described, it will be obvious to those skilled in the art that various changes and modifications may be made without departing from the spirit and scope of the present invention. For example, it is possible to form a prohibition circuit by component transistors exchanged in channel conductivity.

What is claimed is:

1. A prohibition circuit operative to produce a control signal supplied to a power consuming circuit for a prohibition of an operation carried out by said power consuming circuit on the basis of an external signal shifted between an active first voltage level and an inactive second voltage level, said control signal being shifted between an inactive third voltage level and an active fourth voltage level, comprising:
   (a) a raw control signal producing circuit operative to produce a raw control signal shifted from an inactive fifth voltage level to an active sixth voltage level after a power switch on event, said raw control signal being shifted from said active sixth voltage level to said inactive fifth voltage level when a power voltage level excesses a certain voltage level; and
   (b) an adjusting circuit responsive to said raw control signal and said external control signal and operative to produce said control signal of said active fourth voltage level when said raw control signal is shifted from said inactive fifth voltage level to said active sixth voltage level regardless of the voltage level of said external signal, wherein said adjusting circuit continues to produce said control signal of said active fourth voltage level regardless of the voltage level of said raw control signal until said external signal is shifted from said active first voltage level to said inactive second voltage level.

2. A prohibition circuit as set forth in claim 1, in which said raw control signal producing circuit comprises a level shifting circuit operative to produce an output signal following said power voltage level and a first series combination of inverter circuits supplied with said output signal from said level shifting circuit to produce said raw control signal.

3. A prohibition circuit as set forth in claim 2, in which said level shifting circuit comprises a plurality of first load transistors respectively having first conductivity channels and coupled in series between a source of power voltage and an output node thereof, a switching transistor of a second conductivity channel and coupled between said output node and a ground terminal and a second load transistor having said second conductivity channel and coupled between said source of power voltage and said output node thereof.

4. A prohibition circuit as set forth in claim 3, in which each of said first load transistors is larger in current driving capability than said switching transistor.

5. A prohibition circuit as set forth in claim 4, in which each of the inverter circuits forming said first series combination has a p-channel type field effect transistor and an n-channel type field effect transistor coupled in series between said source of power voltage and said ground terminal.

6. A prohibition circuit as set forth in claim 5, in which said n-channel type field effect transistor is larger in current driving capability than said p-channel type field effect transistor.

7. A prohibition circuit as set forth in claim 3, in which said adjusting circuit comprises a second series combination of inverter circuits supplied with said external signal to produce an output signal and a logic circuit responsive to the output signal of the second series combination and said control signal to change the voltage level of the control signal.

8. A prohibition circuit as set forth in claim 7, in which said logic circuit comprises a NAND gate supplied with said output signal of said second series combination and said control signal, a first inverter circuit having an input node coupled to an output node of said NAND gate, a NOR gate supplied with the output signal of said first series combination and an output signal appearing at an output node of the first inverter circuit, and a second inverter circuit having an input node coupled to an output node of said NOR gate to produce said control signal appearing at an output node of the second inverter circuit.

9. A prohibition circuit as set forth in claim 8, in which each of said inverter circuits forming said second series combination has a p-channel type field effect transistor and an n-channel type field effect transistor coupled in series between said source of power voltage and said ground terminal.

10. A prohibition circuit as set forth in claim 8, in which said NAND gate has two p-channel type field effect transistors coupled in parallel between said source of power voltage and an output node thereof and two n-channel type field effect transistors coupled in series between the output node thereof and said ground terminal, wherein one of said p-channel type field effect transistors and one of said n-channel type field effect transistors have respective gate electrodes supplied with the output signal of said second series combination but the other of said p-channel type field effect transistors and the other of said n-channel type field effect transistors have respective gate electrodes supplied with said control signal.

11. A prohibition circuit as set forth in claim 8, in which said NOR gate has two p-channel type field effect transistors coupled in series between said source of power voltage and an output node thereof and two n-channel type field effect transistors coupled in parallel between the output node thereof and said ground terminal, wherein one of said p-channel type field effect transistors and one of said n-channel type field effect transistors have respective gate electrodes supplied with the output signal of said first series combination but the other of said p-channel type field effect transistors and the other of said n-channel type field effect transistors have respective gate electrodes supplied with the output signal of said first inverter circuit, the output signal of said first series combination serving as a raw control signal.

12. A prohibition circuit as set forth in claim 1, in which said power consuming circuit serves as a data output buffer circuit.

13. A prohibition circuit operative to produce a control signal supplied to a data output buffer circuit for a prohibition of an operation carried out by said data output buffer circuit on the basis of an external signal shifted between active a first voltage level and an inactive second voltage level, said control signal being shifted between an inactive third voltage level and an active fourth voltage level, comprising:

(a) a raw control signal producing circuit including a level shifting circuit and a first series combination of inverter circuits, said raw control signal producing circuit being operative to produce a raw control signal from said first series combination of inverter circuits shifted from an inactive fifth voltage level to an active sixth voltage level after a power switch on event, said raw control signal being shifted from said active sixth voltage level to said inactive fifth voltage level when a power voltage level exceeds a certain voltage level; and (b) an adjusting circuit including a second series combination of inverter circuits supplied with said external signal and a logic circuit provided with a NAND gate supplied with an output signal of the second series combination and said raw control signal, a first inverter circuit supplied with an output signal of the NAND gate, a NOR gate supplied with said raw control signal and an output signal of the first inverter circuit and a second inverter circuit supplied with an output signal of the NOR gate to produce said control signal of said active fourth voltage level when said raw control signal is shifted from said inactive fifth voltage level to said active sixth voltage level regardless of the voltage level of said external signal, wherein said second inverter circuit continues to produce said control signal of said active fourth voltage level regardless of the voltage level of said raw control signal until said external signal is shifted from said active first voltage level to said inactive second voltage level.

* * * * *